(12) United States Patent
Pokrovskiy et al.

(10) Patent No.: US 8,110,838 B2
(45) Date of Patent: Feb. 7, 2012

(54) SPATIAL LOCALIZATION OF LIGHT-GENERATING PORTIONS IN LEDS

(75) Inventors: Alexander L. Pokrovskiy, Burlington, MA (US); Michael Lim, Cambridge, MA (US); Nikolay I. Nemchuk, North Andover, MA (US); Alexei A. Erchak, Cambridge, MA (US); Milan Singh Minsky, Newton, MA (US)

(73) Assignee: Luminus Devices, Inc., Billerica, MA (US)

( * ) Notice: Subject to any disclaimer, the term of this patent is extended or adjusted under 35 U.S.C. 154(b) by 0 days.

(21) Appl. No.: 11/636,380

(22) Filed: Dec. 8, 2006

(65) Prior Publication Data

US 2008/0135861 A1 Jun. 12, 2008

(51) Int. Cl.
*H01L 33/00* (2010.01)

(52) U.S. Cl. ............... 257/84; 257/79; 257/86; 257/88; 257/93; 257/98; 438/22; 438/27; 438/29; 438/31; 438/32

(58) Field of Classification Search ............. 257/13, 257/15, 79, 98, E31.033, E33.008, 86, 88, 257/93, 99, 84; 438/32, 22, 27, 29, 31, 42, 438/46, 47
See application file for complete search history.

(56) References Cited

U.S. PATENT DOCUMENTS

| | | | |
|---|---|---|---|
| 3,739,217 A | 6/1973 | Bergh | |
| 4,894,835 A | 1/1990 | Uomi | |
| 5,073,041 A | 12/1991 | Rastani | |
| 5,132,751 A | 7/1992 | Shibata | |
| 5,162,878 A | 11/1992 | Sasagawa | |
| 5,363,009 A | 11/1994 | Monto | |
| 5,426,657 A | 6/1995 | Vakhsoori | |
| 5,491,350 A | 2/1996 | Unno | |
| 5,528,057 A | 6/1996 | Yanagase | |
| 5,600,483 A | 2/1997 | Fan | |
| 5,633,527 A | 5/1997 | Lear | |
| 5,753,940 A | 5/1998 | Komoto | |
| 5,779,924 A | 7/1998 | Krames | |
| 5,793,062 A | 8/1998 | Kish | |
| 5,814,839 A | 9/1998 | Hosoba | |

(Continued)

FOREIGN PATENT DOCUMENTS

EP 1328026 A2 7/2003

(Continued)

OTHER PUBLICATIONS

Bulu, I., et al., "Highly directive radiation from sources embedded inside photonic crystals", Applied Physics Letters 2003, vol. 83, No. 16, 3263-3265.

(Continued)

*Primary Examiner* — Ha Tran T Nguyen
*Assistant Examiner* — Suberr Chi
(74) *Attorney, Agent, or Firm* — Wolf, Greenfield & Sacks, P.C.

(57) ABSTRACT

Light-emitting devices (e.g., LEDs) and methods associated with such devices are provided. In some embodiments, the device includes a distribution of light-generating portions (including active regions) that are spatially localized and separated (e.g., horizontally or vertically) from one or more patterned light extraction portions. This arrangement can allow light generated by the device to propagate and pass through regions of low absorption (e.g., light-extraction portions) rather than in regions of high absorption (e.g., light-generating portions), which can enhance light emission.

21 Claims, 11 Drawing Sheets

U.S. PATENT DOCUMENTS

| | | | |
|---|---|---|---|
| 5,834,331 | A | 11/1998 | Razeghi |
| 5,955,749 | A * | 9/1999 | Joannopoulos et al. ........ 257/98 |
| 6,083,769 | A | 7/2000 | Kurahashi |
| 6,091,085 | A | 7/2000 | Lester |
| 6,346,771 | B1 | 2/2002 | Salam |
| 6,376,864 | B1 | 4/2002 | Wang |
| 6,410,348 | B1 | 6/2002 | Chen |
| 6,410,942 | B1 | 6/2002 | Thibeault |
| 6,420,735 | B2 | 7/2002 | Kim |
| 6,426,515 | B2 | 7/2002 | Ishikawa |
| 6,429,460 | B1 | 8/2002 | Chen |
| 6,469,324 | B1 | 10/2002 | Wang |
| 6,475,819 | B2 | 11/2002 | Franz |
| 6,504,180 | B1 | 1/2003 | Heremans |
| 6,522,063 | B2 | 2/2003 | Chen |
| 6,534,798 | B1 | 3/2003 | Scherer |
| 6,563,142 | B2 | 5/2003 | Shen |
| 6,649,437 | B1 | 11/2003 | Yang |
| 6,657,236 | B1 | 12/2003 | Thibeault |
| 6,661,028 | B2 | 12/2003 | Chen |
| 6,746,889 | B1 | 6/2004 | Eliashevich |
| 6,784,027 | B2 | 8/2004 | Streubel |
| 6,784,463 | B2 | 8/2004 | Camras |
| 6,791,117 | B2 | 9/2004 | Yoshitake |
| 6,791,119 | B2 | 9/2004 | Slater |
| 6,828,597 | B2 | 12/2004 | Wegleiter |
| 6,831,302 | B2 | 12/2004 | Erchak et al. |
| 6,847,057 | B1 | 1/2005 | Gardner |
| 6,870,191 | B2 | 3/2005 | Niki |
| 6,878,969 | B2 | 4/2005 | Tanaka |
| 6,903,379 | B2 | 6/2005 | Wang |
| 6,914,256 | B2 | 7/2005 | Zhang |
| 6,924,163 | B2 | 8/2005 | Okazaki |
| 6,946,683 | B2 | 9/2005 | Sano |
| 6,946,687 | B2 | 9/2005 | Eisert |
| 6,956,246 | B1 | 10/2005 | Epler |
| 6,956,250 | B2 | 10/2005 | Borges et al. |
| 6,958,494 | B2 | 10/2005 | Lin |
| 7,012,279 | B2 | 3/2006 | Wierer, Jr. et al. |
| 7,105,861 | B2 | 9/2006 | Erchak et al. |
| 7,166,871 | B2 | 1/2007 | Erchak |
| 7,211,831 | B2 | 5/2007 | Erchak et al. |
| 7,279,718 | B2 | 10/2007 | Krames et al. |
| 7,348,603 | B2 | 3/2008 | Erchak et al. |
| 7,388,233 | B2 | 6/2008 | Erchak et al. |
| 7,391,059 | B2 | 6/2008 | Erchak et al. |
| 2003/0057444 | A1 | 3/2003 | Niki et al. |
| 2003/0209714 | A1 | 11/2003 | Taskar |
| 2003/0222263 | A1 | 12/2003 | Choi |
| 2004/0012958 | A1 | 1/2004 | Hashimoto et al. |
| 2004/0027062 | A1 | 2/2004 | Shiang |
| 2004/0048429 | A1 * | 3/2004 | Baur et al. ............... 438/200 |
| 2004/0144985 | A1 | 7/2004 | Zhang |
| 2005/0112886 | A1 | 5/2005 | Asakawa |
| 2005/0141240 | A1 | 6/2005 | Hata |
| 2005/0173714 | A1 * | 8/2005 | Lee et al. ............... 257/84 |
| 2005/0205883 | A1 | 9/2005 | Wierer |
| 2006/0027815 | A1 * | 2/2006 | Wierer et al. ............... 257/79 |
| 2007/0085098 | A1 | 4/2007 | Erchak et al. |
| 2007/0295981 | A1 | 12/2007 | Erchak et al. |
| 2008/0070334 | A1 * | 3/2008 | Krames et al. ............... 438/32 |
| 2008/0135861 | A1 | 6/2008 | Erchak et al. |
| 2009/0014740 | A1 | 1/2009 | Erchak et al. |

FOREIGN PATENT DOCUMENTS

| | | |
|---|---|---|
| JP | 02-280611 A | 9/2002 |
| WO | WO 01/24280 A1 | 4/2001 |
| WO | WO 01/41225 | 7/2001 |
| WO | WO 02/41406 | 5/2002 |

OTHER PUBLICATIONS

Erchak, A., et al., "Enhanced coupling to vertical radiation using a two-dimensional photonic crystal in a semiconductor light-emitting diode", Applied Physics Letters 2001, vol. 78, No. 5, 563-565.

Krames, M., et al., "Introduction to the Issue on High-Efficiency Light-Emitting Diodes", IEEE Journal on Selected Topics in Quantum Electronics 2002, vol. 8, No. 2, 185-188.

Lee, Y., et al., "A high-extraction-efficiency nanopatterned organic light-emitting diode", Applied Physics Letters 2003, vol. 82, No. 21, 3779-3781.

Oder, T.N., et al., "III-nitride photonic crystals", Applied Physics Letters 2003, vol. 83, No. 6, 1231-1233.

Wong, W.S., et al., "Damage-free separation of GaN thin films from sapphire substrates", Applied Physics Letters 1998, vol. 72, No. 5, 599-601.

Zelsmann, M., et al., "Seventy-fold enhancement of light extraction from a defectless photonic crystal made on silicon-on-insulator", Applied Physics Letters 2003, vol. 83, No. 13, 2542-2544.

* cited by examiner

SPATIAL LOCALIZATION OF LIGHT-GENERATING PORTIONS IN LEDS

FIELD OF INVENTION

The present embodiments relate generally to light-emitting devices, and more particularly to light-emitting diodes (LEDs), and specifically, to LEDs that have light-generating portions that are spatially isolated from light-extraction portions.

BACKGROUND

A light-emitting diode (LED) can often provide light in a more efficient manner than an incandescent light source and/or a fluorescent light source. The relatively high power efficiency associated with LEDs has created an interest in using LEDs to displace conventional light sources in a variety of lighting applications. For example, in some instances LEDs are being used as traffic lights and to illuminate cell phone keypads and displays. Many technological advances have led to the development of high power LEDs by increasing the amount of light emission from such devices.

Typically, an LED is formed of multiple layers, with at least some of the layers being formed of different materials. In general, the materials and thicknesses selected for the layers influence the wavelength(s) of light emitted by the LED. In addition, the chemical composition of the layers can be selected to promote isolation of injected electrical charge carriers into light-generating portions (commonly referred to as quantum wells or active portions) for relatively efficient conversion to optical power. Generally, the layers on one side of the junction where a quantum well is grown are doped with donor atoms that result in high electron concentration (such layers are commonly referred to as n-type layers), and the layers on the opposite side are doped with acceptor atoms that result in a relatively high hole concentration (such layers are commonly referred to as p-type layers).

In some light-emitting devices, significant absorption of light within a light-generating portion can lead to poor light extraction and/or inefficient collimation of light. Accordingly, light-emitting devices that result in higher efficiency of light extraction and light collimation would be beneficial.

SUMMARY OF THE INVENTION

Light-emitting devices, and related components, systems, and methods associated therewith are provided.

In one embodiment, a light-emitting device is provided. The light-emitting device comprises a distribution of light-generating portions configured to generate light, and at least one light extraction portion that allows generated light to pass therethrough, wherein the light extraction portion is devoid of a light-generating portion.

In another embodiment, a light-emitting device comprises a distribution of light-generating portions configured to generate light, and at least one light extraction portion that allows generated light to pass therethrough. At least a part of the light extraction portion comprises a dielectric function that varies spatially according to a pattern.

In another embodiment, a light-emitting device comprises a distribution of light-generating portions configured to generate light. A surface of at least one of the light-generating portions has a dielectric function that varies spatially according to a first pattern, and at least one light extraction portion allows generated light to pass therethrough. A surface of the light extraction portion has a dielectric function that varies spatially according to a second pattern.

In another embodiment, a light-emitting device comprises a first light-generating portion configured to generate light of one wavelength, and a second light-generating portion configured to generate light of a different wavelength than the first light-generating portion. The second light-generating portion does not substantially absorb light emitted by the first light-generating region. A surface of the second light-generating portion may have a dielectric function that varies spatially according to a pattern.

In another embodiment, a light-emitting device comprises an active region configured to generate light and a light extraction region that allows generated light to pass therethrough, the light extraction region comprising a layer including a dielectric function that varies spatially according to a pattern. The device also includes a low refractive index layer supported by the active region and supporting the layer including the dielectric function, the low refractive index layer having a lower refractive index than that of the active region.

In another embodiment, a light-emitting device comprises a distribution of light-generating portions configured to generate light, each light-generating portion including an active region. The device also includes at least one emission surface that allows generated light to pass therethrough, wherein at least a part of an active region is not positioned above or below the emission surface.

Other advantages and novel features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control. If two or more documents incorporated by reference include conflicting and/or inconsistent disclosure with respect to each other, then the document having the later effective date shall control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures.

DETAILED DESCRIPTION

Figure 1:
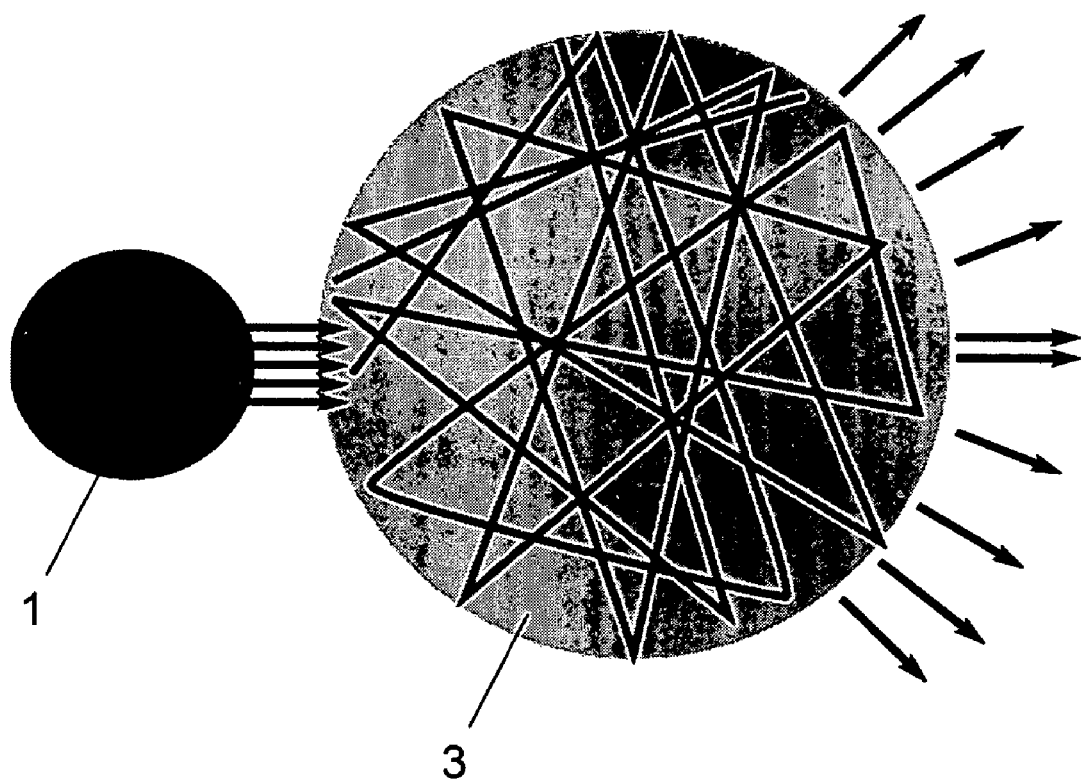
FIG. 1 is a schematic of a LED including a light-generating portion spatially isolated from a light-extraction portion, in accordance with one embodiment of the invention.

Light-emitting devices (e.g., LEDs) and methods associated with such devices are provided. As shown schematically in FIG. 1, an LED may include a light-generating portion 1 (which includes an active region) that is spatially isolated from a light-extraction portion 3. This separation of light-generating portion(s) from light-extraction portion(s) can allow light generated by the device to propagate and pass through regions of low absorption (e.g., light-extraction portions) rather than in regions of high absorption (e.g., light-generating portions). The low absorption regions allow photons to have longer lifetimes and inherently increase the escape probability of the photons, which in turn, can enhance light emission. In some embodiments, the device includes a distribution of light-generating portions that are spatially localized and separated (e.g., horizontally or vertically) from one or more patterned light extraction portions. Accordingly, the device may include a light extraction portion that is devoid of a light-generating portion. The devices may include one or more series of light extraction portions with features arranged in a first and/or second pattern, which may be formed on one or more interfaces of the device (e.g., an emission surface). As described further below, the patterns can be defined by a series of features (e.g., holes) having certain characteristics (e.g., feature size, depth, nearest neighbor distances) which may be controlled to influence properties of the light emitted from the device, including improving extraction and/or collimation of the emitted light.

FIGS. 2-5 show examples of LEDs having one or more light-generating portions that are spatially localized and separated horizontally from one or more light extraction portions. In such embodiments, at least one light extraction portion is devoid of a light-generating portion.

Figure 2:
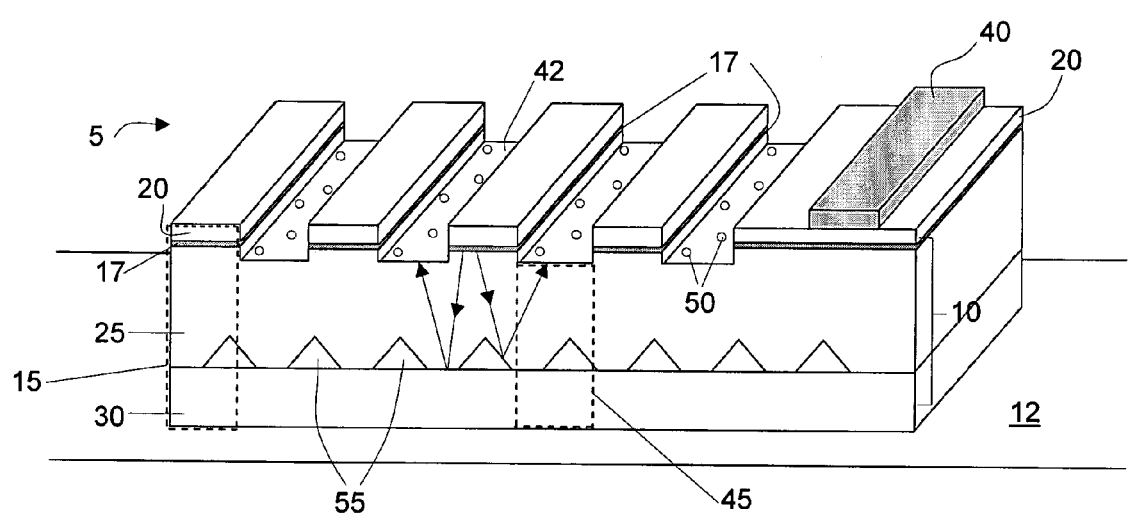
FIG. 2 is a schematic of an LED including a distribution of light-generating portions and patterned light extraction portions, in accordance with one embodiment of the invention.

FIG. 2 is an illustrative example of an LED die that forms the light-generating component of a light-emitting device, in accordance with one embodiment. It should also be understood that various embodiments presented herein can also be applied to other light-emitting devices, such as laser diodes, and LEDs having different structures. LED 5 shown in FIG. 2 comprises a multi-layer stack 10 that may be disposed on support structure 12. The multi-layer stack 10 can include a distribution of light-generating portions 15 including active regions 17. As illustrated, the light-generating portions can be formed between n-doped layer(s) 20 and p-doped layer(s) 25. The stack can also include an electrically conductive layer 30 which may serve as a p-side contact, and can also serve as an optically reflective layer. An n-side contact pad 40 is disposed on layer 20. Because LED 5 is a single light-emitting diode with several light-generating portions and light extraction portions, each of the light-generating portions do not require a contact pad on layer 20. It should be appreciated that the LED is not limited to the configuration shown in FIG. 2, for example, the n-doped and p-doped sides may be interchanged so as to form a LED having a p-doped region in contact with the contact pad 40 and an n-doped region in contact with layer 30.

An electrical potential may be applied to the contact pads which can result in light generation within active regions 17 and emission of at least some of the light generated through emission surfaces 42 of light extraction portions 45. The light extraction portion functions as an optical cavity. The lifetime of a photon that passes into the light extraction portion is increased relative to the lifetime of the photon in light generating portions 15, where the photon may be absorbed by an active region. As shown in FIG. 2, the light extraction portion includes electrically conductive layer 30 which can function as an optically reflective surface (e.g., a mirror). The light extraction portion can also include other feature(s) that enhance light extraction and emission. For example, as described further below, holes 50 may be defined in a light-emitting interface (e.g., emission surface 42) of a light extraction portions to form a pattern (e.g., a photonic lattice) that can influence light emission characteristics, such as light extraction, light collimation, and/or light emission from the device. In such embodiments, the light may be coupled to the photonic lattice states in the light extraction portion, thereby increasing the probability of the light being emitted from the device. Accordingly, a majority (e.g., greater than 50%) of the light generated may be emitted through emission surfaces 42 of the light extraction portions. In certain embodiments described herein, greater than 50%, greater than 70%, or greater than 90% of the light generated in a light-generating portion is emitted through a light extraction portion.

As shown in the illustrative embodiment of FIG. 2, the light extraction portions are devoid of a light-generating portion (and, therefore, devoid of an active region). Moreover, the light-generating and light extraction portions are spatially localized and separated from one another horizontally across the die. That is, at least a part of a light-generating portion 15 (or active region 17) is not positioned above or below a light extraction portion 45.

In some embodiments, at least one light-generating portion (or active region) is not positioned above or below a light extraction portion. In some embodiments, substantially all of the light-generating portions (or active regions) are not positioned above or below the light extraction portions.

A portion (e.g., layer, structure, region) referred to as being "above" or "below" another portion means that it lies substantially vertically above or below the portion, respectively. When a portion is "above", "on", "over", "overlying", or "supported by" another portion, it can be directly on the portion, or an intervening portion (e.g., layer, structure, region) also may be present. Similarly, when a portion is "below" or "underneath" another portion, it can be directly below the portion, or an intervening portion (e.g., layer, structure, region) also may be present. A portion that is "directly on", "in contact with", "or directly supported by" another portion means that no intervening portion is present. It should also be understood that when a portion is referred to as being "above", "on", "over", "overlying", "in contact with", "below", or "supported by" another portion, it may cover the entire portion or a part of the portion.

Also shown in FIG. 2 are the light extraction portions including a pattern having certain features (e.g., holes) and characteristics (e.g., feature size, depth, nearest neighbor distances). It should be understood, however, that other modifications can be made to the representative LED structure presented, and that embodiments are not limited in this respect.

The light-generating portions of an LED can include one or more active regions (quantum wells) surrounded by barrier layers. The quantum well structure may be defined by a semiconductor material layer (e.g., in a single quantum well), or more than one semiconductor material layers (e.g., in multiple quantum wells), with a smaller electronic band gap as compared to the barrier layers. Non-limiting examples of suitable semiconductor material layers for the quantum wells can include AlGaInP, InGaN, AlGaN, GaN and combinations of these layers (e.g., alternating InGaN/GaN layers, where a GaN layer serves as a barrier layer). In general, LEDs can include a quantum well comprising one or more semiconductors materials, including III-V semiconductors (e.g., GaAs, AlGaAs, AlGaP, GaP, GaAsP, InGaAs, InAs, InP, GaN, InGaN, InGaAlP, AlGaN, as well as combinations and alloys thereof), II-VI semiconductors (e.g., ZnSe, CdSe, ZnCdSe, ZnTe, ZnTeSe, ZnS, ZnSSe, as well as combinations and alloys thereof), and/or other semiconductors. By incorporating a distribution of quantum wells within the light-generating portions (optionally with patterned light extraction portions) and/or by separating the light-generating portions from the light extraction portions as described herein, absorption of generated light in the light-generating layer may be decreased, thereby improving extraction and/or collimation of the emitted light. It should be understood, that other materials used to form light-generating layers can be used in devices described herein. Furthermore, other light-emitting materials such as quantum dots or organic light-emission layers may be used.

N-doped layer(s) 20 can include a silicon-doped GaN layer (e.g., having a thickness of about 4000 nm thick) and/or p-doped layer(s) 25 include a magnesium-doped GaN layer (e.g., having a thickness of about 40 nm thick). Electrically conductive layer 30 may be a silver layer (e.g., having a thickness of about 100 nm), which may also serve as an optically reflective layer (e.g., that reflects upwards any downward propagating light generated by active regions 17). In some embodiments, the device can also include focusing elements 55 (e.g., concave/convex mirror-like surfaces and Fresnel-zone plates). The focusing elements may enhance the manipulation of generated light such that more photons are brought to an emission surface 42 at the desired range of angles, thereby allowing more light to be emitted from the surface. Furthermore, although not shown, other layers may also be included in the LED. For example, in one embodiment, an AlGaN layer may be disposed between active regions 17 and p-doped layer(s) 25; in another embodiment, a low index of refraction material may be disposed between two layers of materials. It should be understood that compositions and configurations other than those described herein may also be suitable for the layers of the LED.

Light may be generated by the LED as follows. The p-side contact layer can be held at a positive potential relative to the n-side contact pad, which causes electrical current to be injected into the LED. As the electrical current passes through the active regions of the light-generating portions, electrons from the n-doped layer(s) can combine in the active regions with holes from p-doped layer(s), which can cause the active regions to generate light. The active regions generate light with a spectrum of wavelengths characteristic of the material from which the light-active regions are formed. For InGaN/GaN quantum wells, the spectrum of wavelengths of light generated by the active regions can have a peak wavelength of about 445 nanometers (nm) and a full width at half maximum (FWHM) of about 30 nm, which is perceived by human eyes as blue light. The light emitted by the LED may be influenced by any patterned interface through which light passes, whereby the pattern can be arranged so as to influence light extraction and/or collimation.

In other embodiments, the active regions of the light-generating portions can generate light having a peak wavelength corresponding to ultraviolet light (e.g., having a peak wavelength of about 370-390 nm), violet light (e.g., having a peak wavelength of about 390-430 nm), blue light (e.g., having a peak wavelength of about 430-480 nm), cyan light (e.g., having a peak wavelength of about 480-500 nm), green light (e.g., having a peak wavelength of about 500 to 550 nm), yellow-green (e.g., having a peak wavelength of about 550-575 nm), yellow light (e.g., having a peak wavelength of about 575-595 nm), amber light (e.g., having a peak wavelength of about 595-605 nm), orange light (e.g., having a peak wavelength of about 605-620 nm), red light (e.g., having a peak wavelength of about 620-700 nm), and/or infrared light (e.g., having a peak wavelength of about 700-1200 nm).

It should be understood that not all of the features shown in FIG. 2 need be present in all embodiments of the invention and that the illustrated elements may be otherwise positioned. Also, additional elements may be present in other embodiments. Additional embodiments are shown in the other figures and/or described further below.

Figure 3A:
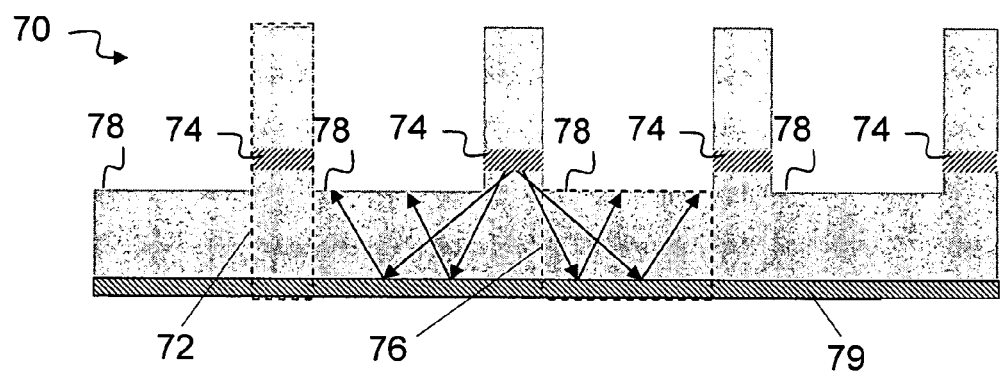
FIG. 3A is a schematic of a cross-sectional view of an LED, in accordance with one embodiment of the invention.

FIG. 3A shows another example of a light-emitting device having a distribution of light-generating portions separated horizontally from light extraction portions. As illustrated in FIG. 3A, LED 70 includes a distribution of light-generating portions 72 including active regions 74. The light-generating portions are separated spatially from light extraction portions 76 (which include emission surfaces 78) such that at least one light extraction portion is devoid of a light-generating portion. Moreover, at least a portion of an active region is not positioned above or below a light extraction portion. Spatial localization of the light-generating portions can allow photons generated in the light-generating portions to propagate primarily in areas of low absorption instead of being absorbed in the light-generating portions. Accordingly, much of the light generated may be emitted through emission surfaces 78 of the light extraction portions. For instance, in some embodiments, greater than 50%, greater than 70%, or greater than 90% of the light generated can be emitted through the light extraction portions. The photons can be reflected by optically reflective layer 79 towards emission surface 78 and may be emitted from the device. As shown, emission surfaces 78 are not patterned. In other embodiments, however, the emission surfaces can be patterned, for example, in the form of a photonic lattice.

Optically reflective regions (e.g., layers) may be substantially reflective to photons and can be formed of any suitable material or material combination (e.g., silver, a Bragg mirror formed by a stack of dielectric layers). In some cases, optically reflective regions are electrically conductive and optionally may serve as an n- or p-side contacts. Although optically reflective regions positioned below a light-generating region are shown in certain figures, it should be understood that the regions can be in any suitable position. For example, in one embodiment a substantially optically reflective region is positioned over at least one active region.

Figure 3B:
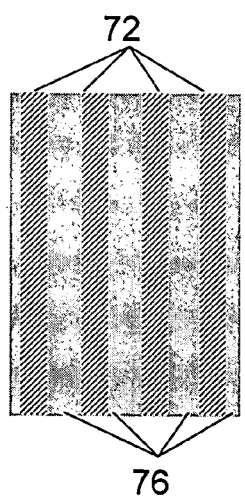
FIG. 3B is a schematic showing a top view of the LED shown in FIG. 3A, in accordance with one embodiment of the invention.
Figure 3C:
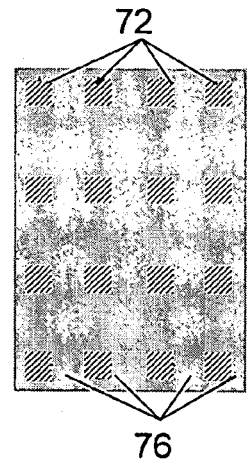
FIG. 3C is a schematic showing another top view of the LED shown in FIG. 3A, in accordance with one embodiment of the invention.

FIG. 3B shows one example of a top view of LED 70 of FIG. 3A according to one embodiment of the invention. As illustrated, light-generating portions 72 may be arranged in a one-dimensional distribution across the device. However, in other embodiments, as shown in FIG. 3C, light-generating portions may be arranged in a two-dimensional distribution.

Figure 4A:
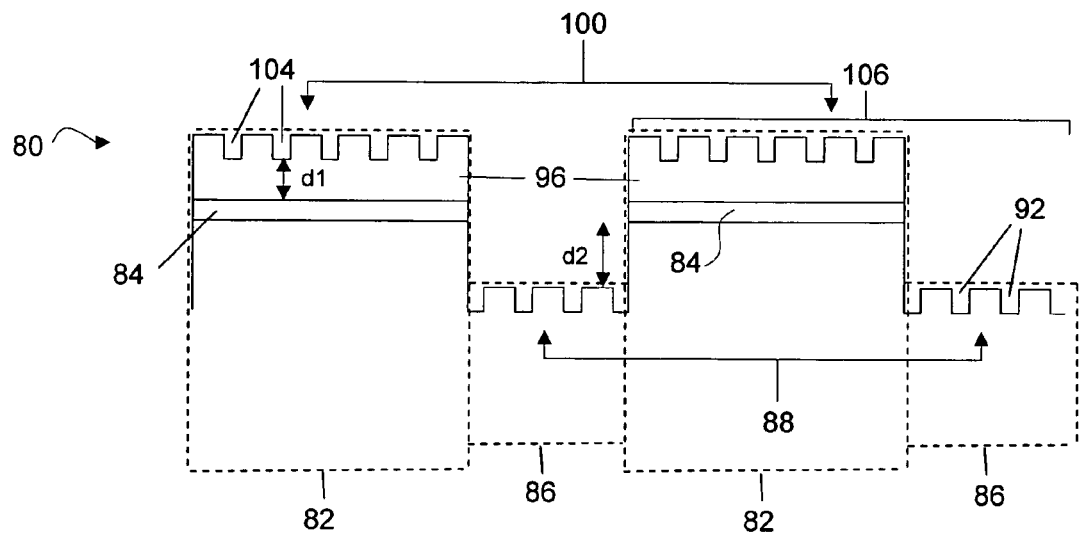
FIG. 4A is a schematic of a cross-sectional view of an LED including a distribution of light-generating portions and light extraction portions, each portion having a patterned emission surface, in accordance with one embodiment of the invention.

FIG. 4A shows another illustrative example of a light-emitting device having a distribution of light-generating portions separated horizontally from a series of light extraction portions. As illustrated in FIG. 4A, LED 80 includes light-generating portions 82 including active regions 84, which are spatially isolated from light extraction portions 86. The light extraction portions can include emission surfaces 88 having several features 92 arranged in a first pattern. Optionally, light-generating portions 82 may include a layer positioned above the active region, the layer including an emission surface 100 having features 104 arranged in a second pattern. As shown, a single light-generating portion 82 and a single light-extraction portion 86 form unit cell 106 of the device, which can be arranged to form a pattern (periodic, quasi-periodic, or random).

Advantageously, by separating light-generating portions 82 from light extraction portions 86, photons generated in the light-generating portions can be injected into light extraction portions where they can propagate in regions of low absorption. Moreover, by combining isolated light-generating portions with patterned emission surfaces 88 and/or 100, light extraction from the device can be substantially improved (e.g., by a factor of three or more depending on the particular design) by increasing the probability of photon coupling to the leaky photonic state of features 92 or 104 of the emission surfaces. Such arrangements of light-generating and light extraction portions can result in enhanced photon extraction from the device, as well as collimation and/or polarization of light.

Figure 4B:
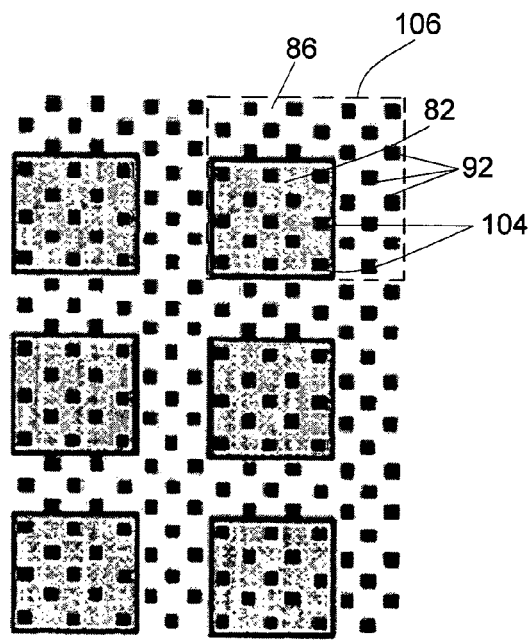
FIG. 4B is a schematic of a top view of the LED shown in FIG. 4A, in accordance with one embodiment of the invention.

As illustrated in a top view of device 80 shown in FIG. 4B, features 92 and 104 have the same dimensions and are arranged in a similar pattern. In other embodiments, however, features from two light-extraction portions of a device can have different dimensions and/or spatial arrangements. It should be appreciated that although the patterns are periodic in this illustration, this need not necessarily always be the case. For example, one or more of the patterns may be non-periodic, non-periodic with a detuned pattern, or periodic.

FIGS. 5A-5E show additional examples of unit cells of a light-emitting device according to another embodiment of the invention. As shown in the embodiment illustrated in FIG. 5A, unit cell 120 having a period 122 includes light-generating portion 131 including active region 124, which is isolated spatially from light extraction portions 126 (and, thus, emission surfaces 127 associated therewith) such that at least one light extraction portion is devoid of a light-generating portion. In addition, at least a part of active region 124 is not positioned above or below one of the light extraction portions. As shown, the active region is part of structure 128 (e.g., an n-doped or p-doped region), which is patterned with features 130 at an emission surface 133. As such, light generated in active region 124 can be emitted from the device via emission surfaces 127 and/or 133. In some instances, light generated from the active regions can be extracted by reflecting off of optically reflective surface 132 towards light extraction portions 126.

Figure 5A:
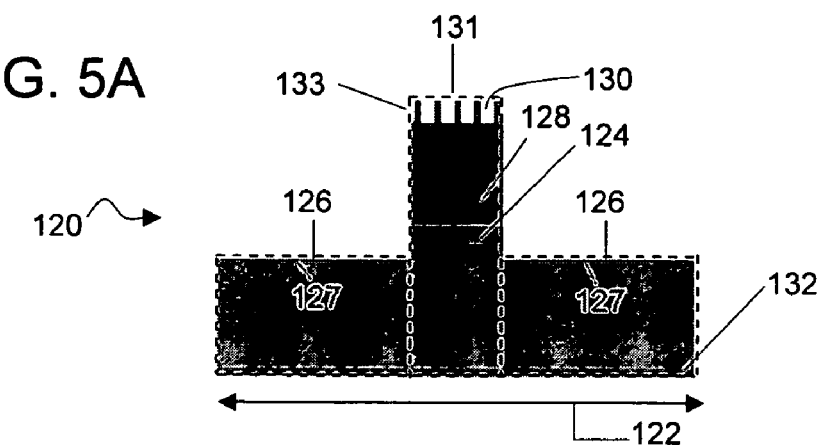
FIGS. 5A-5E are schematics of cross-sectional views of units cells of LEDs, in accordance with some embodiments of the invention.
Figure 5B:
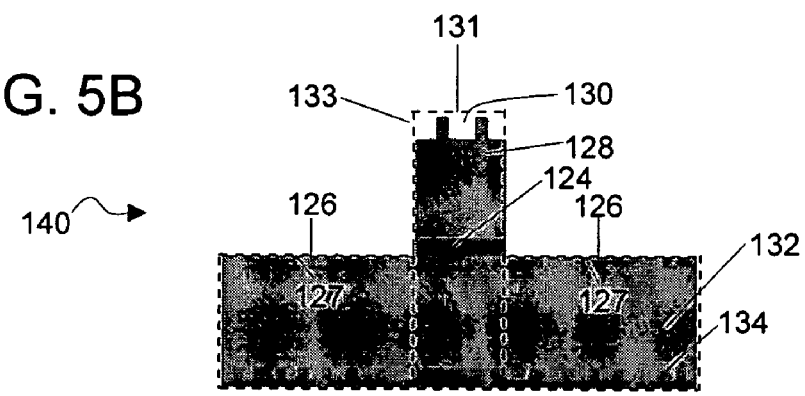

As shown in the embodiment illustrated in FIG. 5B, active region 124 can be positioned in any suitable arrangement with respect to structure 128 (e.g., along various heights of structure 128), while at least a part of the active region is not positioned above or below one of the light extraction portions. In addition, features 130 can have different configurations (e.g., size, dimensions, and nearest-neighbor distances), which may depend on, for example, the particular material used to form the light-generating portion, the dimensions of the light-generating portions, and/or the materials and dimensions used to form the n-doped and/or p-doped regions. Unit cell 140 may also include a patterned optically reflective surface 132, including features 134. The size and dimensions of features 134 can be chosen such that photons emitted from light-generating portion 131 can reflect off of the optically reflective surface at a desired range of angles to increase emission of the photons from light extraction portion 126.

Figure 5C:
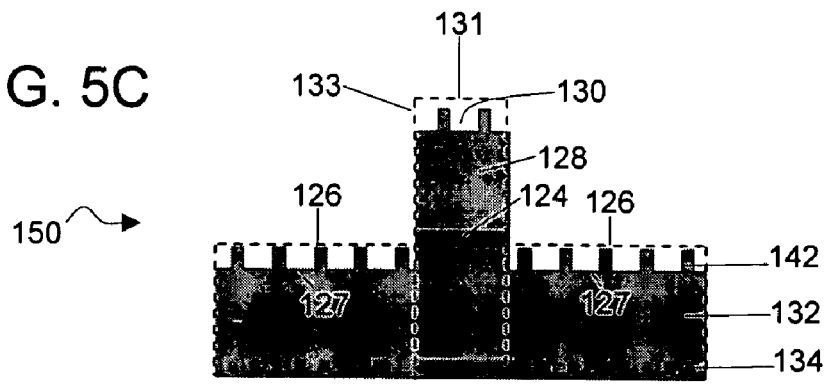

As shown in the embodiment illustrated in FIG. 5C, unit cell 150 of a light-emitting device can additionally include a light extraction portion 126 that is patterned with features 142.

Figure 5D:
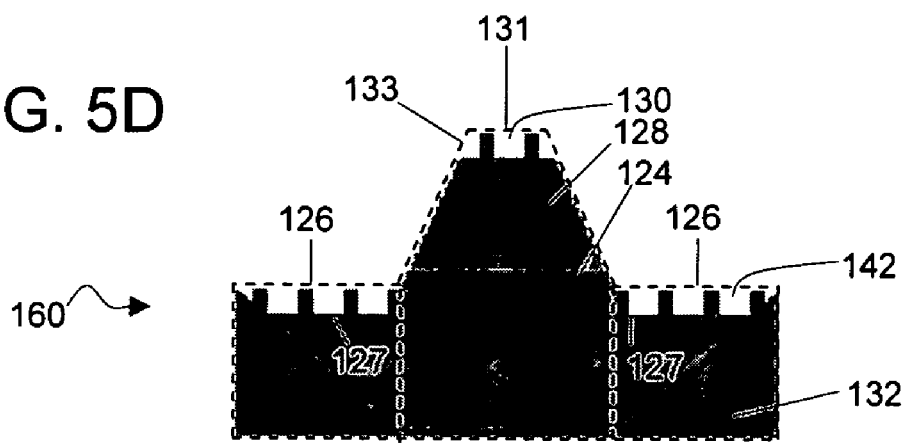
Figure 5E:
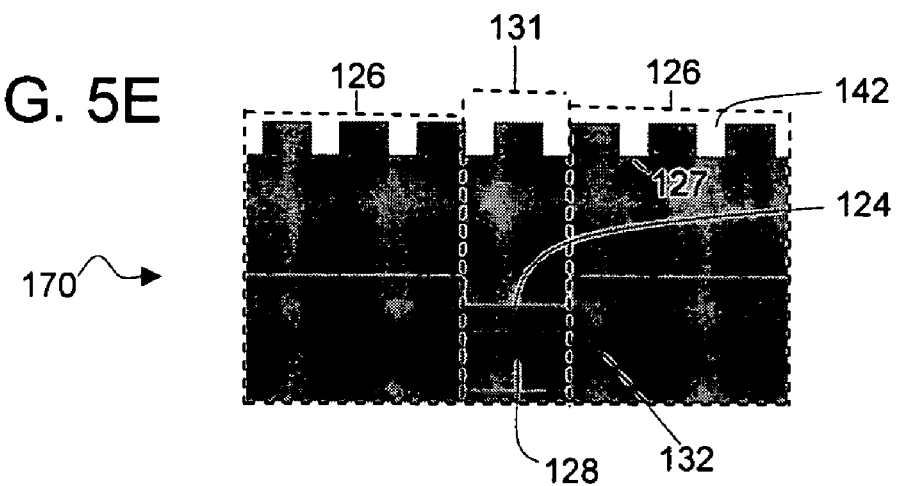

FIG. 5D shows an illustrative example of a unit cell 160, which includes light-generating portion 124 arranged on structure 128 having angled walls (e.g., pyramids) that can further enhance light extraction. Unit cell 160 also includes optically reflective surface 132, which is also positioned at an angle, and can increase the reflection of photons generated in the light-generating portions toward light extraction portions 126.

FIGS. 5A-5D show examples of light-generating portions that are spatially localized such that at least a part of an active region is not positioned above or below at least one light extraction portion of the device. As shown in the embodiment illustrated in FIG. 5E, in some cases light-generating portion 131 including active region 124 can be spatially isolated as a part of structure 128, which is positioned below an emission surface 127. The emission surface is part of both light extraction regions 126 and the light-generating region. This maximizes area of the emission surface, which can significantly increase the light output. One or more optically reflective surfaces 132 may be positioned adjacent the active region.

Light-generating portions (and active regions) can be arranged in any suitable distribution in a device. In the embodiments illustrated in FIGS. 2-4, the light-generating portions are positioned equidistant from one another. In other embodiments, however, this need not be the case. For example, a device may be formed of two or more different unit cells including light-generating portions having different arrangements relative to the period of each unit cell. In other cases, light-generating portions can be arranged randomly on a device.

Light-generating portions may be characterized as having an average width. As used herein, "average width" refers to the average lateral cross-sectional dimension of the light-generating portions of a device. In some embodiments, the average width of light-generating portions of a device may be in the range between 1-500 microns. It should be understood, however, that light-generating portions of a device can have any suitable width and that the invention is not limited in this respect.

In certain embodiments, light-generating portions of a device have at least one cross-sectional dimension greater (e.g., at least 5, 10, or 15 times greater) than a cross-sectional dimension of a feature in a light-extraction portion. In other embodiments, at least one light-generating portion has a cross-sectional dimension equal to or less than a cross-sectional dimension of a light extraction portion.

In some embodiments, the device may be designed to have a particular ratio of average width of a light-generating portion to the period of the structure. For example, a device may include a ratio of average width of a light-generating portion to the period of the structure of about 1:2, 1:5, or 1:10. As used herein, the above-mentioned periodicity refers to the length of the unit cell along at least one dimension in a periodic pattern, but in cases where a pattern is not periodic, average nearest neighbor distance can be similarly used to characterize a pattern.

In general, as used herein, a pattern includes two or more features having similar characteristics (e.g., shape, size). Features are parts of a device that deviate from a reference (e.g., planar) interface. The features may be holes that extend (e.g., downwards) from the reference interface, or the features may be posts that extend (e.g., upwards) from the reference interface. It should be understood that a "hole" generally refers to any type of localized void that extends from a reference interface into a material layer, including holes that extend through the entire device or holes that extend through only a portion of the device.

In some embodiments, light extraction portions described herein have a dielectric function that varies spatially according to a pattern which can influence the extraction efficiency and/or collimation of light emitted by the LED. In the embodiment illustrated in FIG. 2, light extraction portions 45 are defined by a pattern formed of holes, but it should be appreciated that the variation of the dielectric function at an interface need not necessarily result from holes. Any suitable way of producing a variation in dielectric function according to a pattern may be used. For example, the pattern may be formed by varying the composition of layer 20 and/or emission surface 42. The pattern may be periodic (e.g., having a simple repeat cell, or having a complex repeat super-cell), or non-periodic. As referred to herein, a complex periodic pattern is a pattern that has more than one feature in each unit cell that repeats in a periodic fashion. Examples of complex periodic patterns include honeycomb patterns, honeycomb base patterns, (2×2) base patterns, ring patterns, and Archimedean patterns. In some embodiments, a complex periodic pattern can have certain holes with one diameter and other holes with a smaller diameter. As referred to herein, a non-periodic pattern is a pattern that has no translational symmetry over a unit cell that has a length that is at least 50 times the peak wavelength of light generated by one or more light-generating portions. Examples of non-periodic patterns include aperiodic patterns, quasi-crystalline patterns (e.g., quasi-crystal patterns having 8-fold symmetry), Robinson patterns, and Amman patterns. A non-periodic pattern can also include a detuned pattern (as described in U.S. Pat. No. 6,831,302 by Erchak, et al., which is incorporated herein by reference). In some embodiments, a device may include a roughened surface. The surface roughness may have, for example, a root-mean-square (rms) roughness about equal to an average feature size which may be related to the wavelength of the emitted light.

In certain embodiments, an interface of a light-emitting device is patterned with holes which can form a photonic lattice. Suitable LEDs having a dielectric function that varies spatially (e.g., a photonic lattice) have been described in, for example, U.S. Pat. No. 6,831,302 B2, entitled "Light-emitting Devices with Improved Extraction Efficiency," filed on Nov. 26, 2003, which is herein incorporated by reference in its entirety. High extraction efficiency for an LED implies a high power of the emitted light and hence high brightness which may be desirable in various optical systems.

It should also be understood that other patterns are also possible, including a pattern that conforms to a transformation of a precursor pattern according to a mathematical function, including, but not limited to an angular displacement transformation. The pattern may also include a portion of a transformed pattern, including, but not limited to, a pattern that conforms to an angular displacement transformation. The pattern can also include regions having patterns that are related to each other by a rotation. A variety of such patterns are described in U.S. patent application Ser. No. 11/370,220, entitled "Patterned Devices and Related Methods," filed on Mar. 7, 2006, which is herein incorporated by reference in its entirety.

In general, the features of a pattern may have any suitable shape. For example, in the illustrative example of FIG. 4A, patterned light extraction portions 86 comprise features 92 having a square-shaped cross-section, but it should be appreciated that other types of cross-sections may also be utilized including pyramidal profiles, trapezoidal profiles, rectangular profiles, arc profiles, semi-circular profiles, semi-elliptical profiles, the inverse profiles of such shapes and/or any other shape, as the invention is not limited in this regard. It should also be appreciated that the cross-sectional profile of the features may be different along different directions (i.e., different cross-sectional views of the feature).

Patterns may be characterized as having an average feature (e.g., hole) size. As used herein, "average feature size" refers to the average cross-sectional dimension of features of a pattern. As shown in FIG. 4A, the average feature size of features 92 is the average of the cross-sectional dimensions of features 92. The average cross-sectional dimension of a feature may be determined by standard techniques including microscopy techniques (e.g., SEM, AFM) by those of ordinary skill in the art.

In some embodiments, a pattern with suitable feature (e.g., hole) sizes on an interface (e.g., having an average feature size between 0.05 and 10 times the free-space wavelength of the emitted light) can create a dielectric function which varies spatially along the interface. The peak wavelength of the emitted light may depend, at least in part, on the specific embodiment of the device. It is believed that this dielectric function variation can alter the density of radiation modes (i.e., light modes that emerge from surface) and guided modes (i.e., light modes that are confined within multi-layer stack) within the LED. This alteration in the density of radiation modes and guided modes within the LED can result in some light (that would otherwise be emitted into guided modes in the absence of the pattern) to be scattered (e.g., Bragg scattered) into modes that can leak into radiation modes.

Patterns may also be characterized as having an average feature depth (e.g., for holes) or average feature height (e.g., for posts). As used herein, the "average feature depth" refers to the average distance holes of the pattern extend from the reference interface; while the "average feature height" refers to the average distance posts of the pattern extend from the reference interface. As shown in FIG. 4A, the average feature depth of patterned light extraction portion 86 is the average depth of features 92.

Typical average feature depths (or heights) can be between about 0.01 micron and 10 microns, though the invention is not limited in this regard. For example, in some cases, the patterned light extraction portion may have an average feature depth of less than about 1 micron (e.g., about 0.5 microns). In some embodiments, it may be advantageous for the feature depth of at least one patterned light extraction portion to be selected so that the resulting pattern is positioned close to the light-generating portions. That is, the distance between the patterned light extraction portion and the light-generating portion is relatively small in these embodiments. For example, the distance between the upper surface of active regions 84 and the bottom surface of features 104 of the emission surface (d1 on FIG. 4A) may be less than about 10 microns (e.g., about 0.9 microns). The distance between the bottom surface of active regions 84 and the top surface of the features 92 of the light extraction portions 86 (d2 on FIG. 4A) may be less than about 2 microns (e.g., about 0.9 microns).

In some embodiments, it may be preferable for the average feature size of one of the patterns (e.g., at an emission surface of a light extraction portion) to be different than the average feature size of another pattern (e.g., at an emission surface of a light-generating portion or a second light extraction portion). For example, the average feature size of one pattern may be greater (e.g., at least 2, 5, 10, or 25 times greater) than the average feature size of another pattern. It should be understood, however, that the invention is not limited to the average feature sizes noted above and that, in certain embodiments, the average feature size of one pattern may be similar to the average feature size of another pattern.

In the embodiment illustrated in FIG. 2, the patterned light extraction portion includes a patterned emission surface, the pattern formed in the n-doped layer(s), but it should be understood that the pattern(s) may be present at any other interface within the LED, including interfaces between two layers within the device. For example, an interface may be formed between two layers; or, between one layer and the surroundings (e.g., atmosphere or another structure mounted on the aforementioned layer). In some embodiments, one or more patterns can be located at a buried interface (e.g., at an interface between two layers) within the LED stack. For instance, in certain embodiments, emission surface 42 is not an uppermost layer of a device; e.g., a layer of material may be positioned above (and may be in contact with) the emission surface.

Several arrangements of patterned light-generating and light extraction portions with respect to interfaces are possible. For instance, in some embodiments, one (or more) patterns cover the entire area of an interface. In other embodiments, one (or more) of the patterns cover only a portion of an interface.

The extraction of light may be affected by the nearest neighbor distance between pattern features and by the feature size (i.e., filling factor within the pattern). It is believed that enhanced extraction efficiency can occur for an average nearest neighbor distance about equal to the wavelength of light in vacuum, although the invention is not limited in this respect. For periodic patterns containing one type of feature (e.g., one light extraction portion and/or one light-generating portion) per unit cell, the nearest neighbor distance is the same as the periodicity. Feature size can also be represented by filling factor which refers to the percentage of area of material removed (or added) to form the pattern compared to the area of the interface. In some embodiments, the filling factor may be between about 25% and about 75% (e.g., about 50%).

Figure 6:
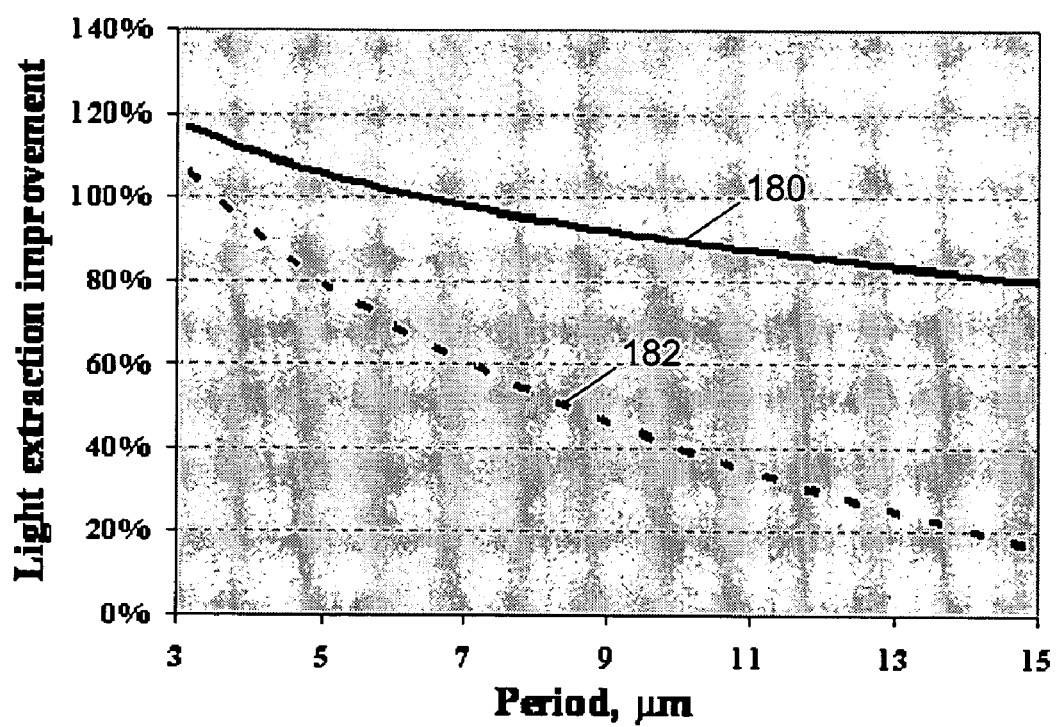
FIG. 6 is a plot comparing light extraction improvement in LEDs with and without a distribution of light-generating portions, in accordance with one embodiment of the invention.

FIG. 6 is a plot of simulated results illustrating light extraction improvement in LEDs including a distribution of light-generating portions compared to LEDs without a distribution of light-generating portions. Line 180 was produced by an LED with a one-dimensional pattern having a 1:5 ratio of the average width of the light-generating portions to the period of the structure; the LED also included a light extraction portion comprising an emission surface patterned in the form of a photonic lattice. Line 182 was produced by an LED with a two-dimensional pattern of the same 1:5 ratio described above, but without a patterned light extraction portion. The simulations were performed for the absorption coefficient of the active material equal to $10^4$ 1/cm (a typical value of absorption coefficient in an active material). The extraction improvement can vary and may depend on the particular absorption coefficient of the active material.

Figure 7:
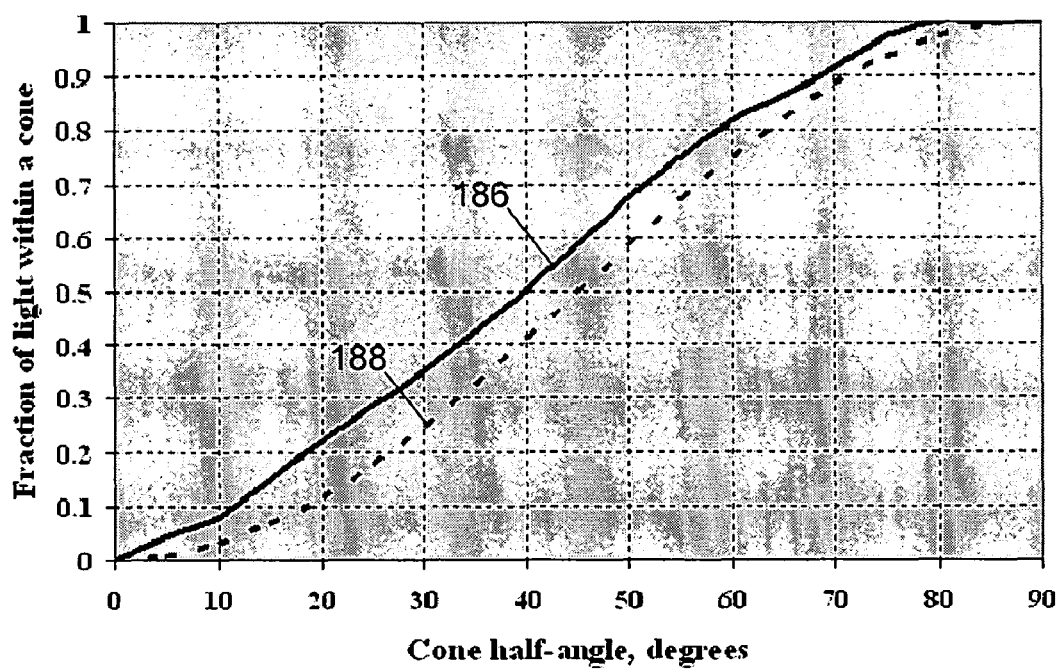
FIG. 7 is a plot comparing the amount of light collected from an LED with the angle of which the light was emitted, in accordance with one embodiment of the invention.

FIG. 7 shows a plot of simulated results illustrating collimating property of an LED. Line 186 was produced by an LED having a one-dimensional pattern with a 1:5 ratio of the average width of the light-generating portions to the period of the structure, and a 10 micrometer period. The plot compares the amount of light collected with the angle into which the light was emitted. For instance, if light was collected from all angles (theta=90 degrees), then the light collected was all light that was emitted. Comparison is made with the so-called Lambertian emitter (e.g., where brightness is the same in all directions), which gave line 188. The plot shows that LEDs having a distribution of light-generating portions emit more light into small angles (e.g., angles with respect to the normal to the LED) compared to LEDs that do not have a distribution of light-generating portions. This means the LED having a distribution of light-generating portions appears brighter when one observes the emitted light in the normal direction. This characteristic is often beneficial, e.g., in etendue limited optical systems.

Figure 8:
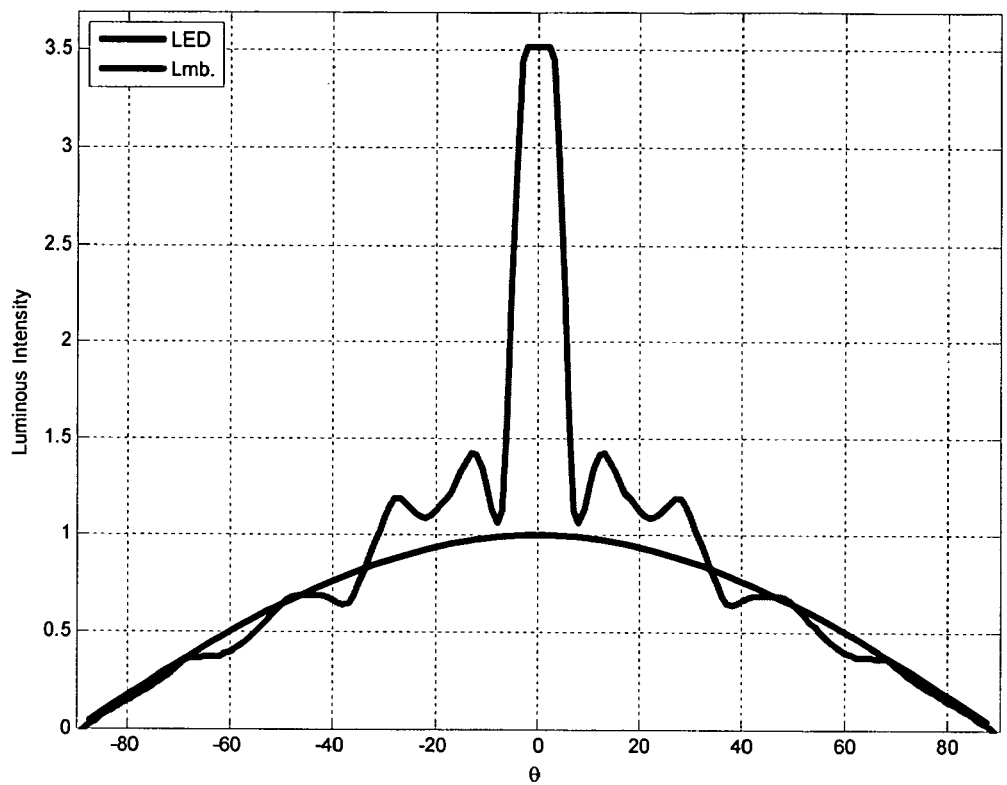
FIG. 8 is a plot showing angular intensity distribution of light from an LED, in accordance with one embodiment of the invention.

FIG. 8 is a plot of simulated results showing angular intensity distribution of light of an LED having a photonic lattice. As illustrated in this figure, most of the light emitted from an LED is in the normal direction.

Figure 9:
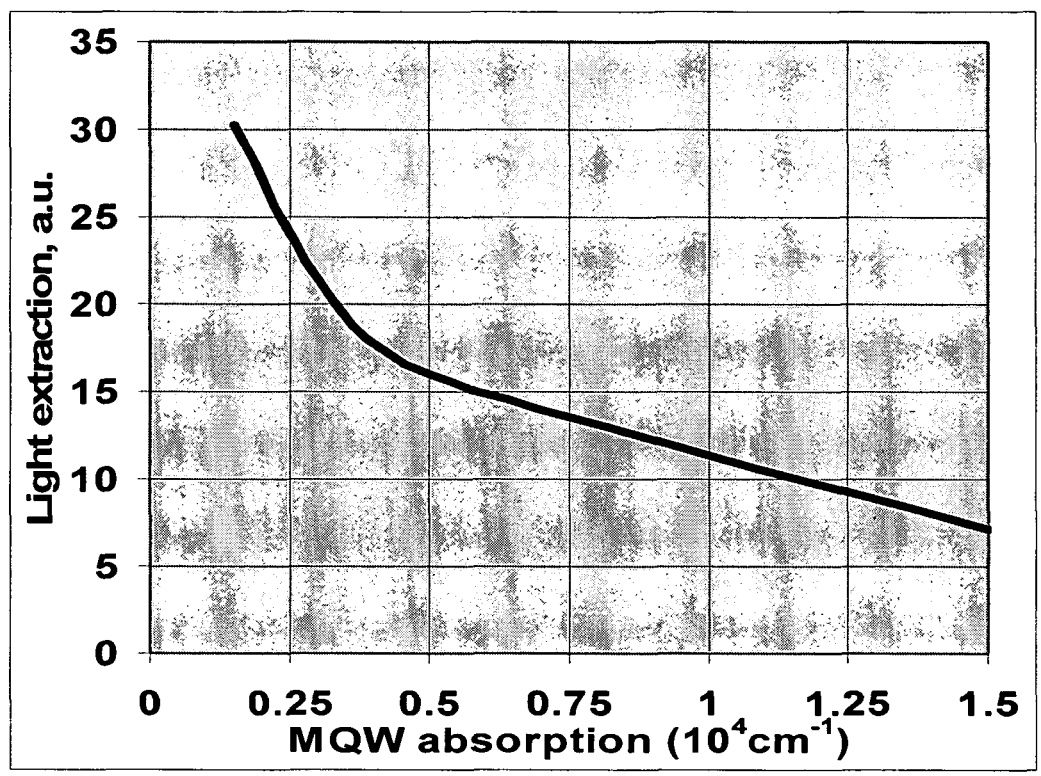
FIG. 9 is a plot showing and how absorption of light within quantum wells of an LED affects the brightness of the LED, in accordance with one embodiment of the invention.

FIG. 9 is a plot of simulated results showing how absorption of light within quantum wells of an LED affects the brightness of the LED (i.e., the amount of light emitted from the LED).

In some embodiments, devices include a first light-generating portion configured to generate light of one wavelength and a second light-generating portion configured to generate light of a different wavelength than the first light-generating portion. In some cases, the second light-generating portion does not substantially absorb light emitted by the first light-generating portion. For instance, the second light-generating portion may absorb less than 30%, less than 20%, less than 10%, or less than 5% of the light emitted by the first light-generating portion. A surface of the first and/or second light-generating portion(s) may have a dielectric function that varies spatially according to a pattern.

Figure 10:
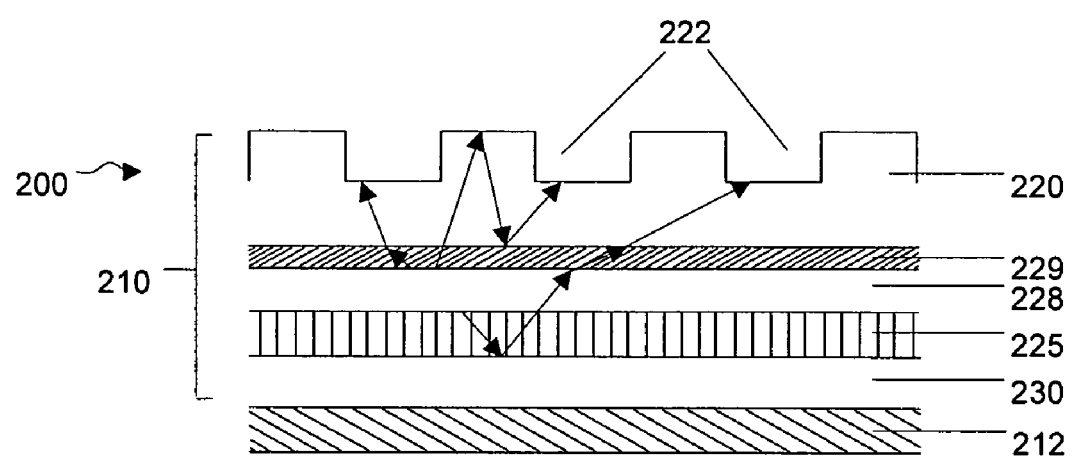
FIG. 10 is a schematic of an LED including an active region separated from a patterned emission surface by a low refractive index material, in accordance with one embodiment of the invention.

FIG. 10 shows an example of a part of an LED including an active region that is separated vertically from an emission surface by a low index of refraction material. As shown in the embodiment illustrated in FIG. 10, LED 200 comprises a multi-layer stack 210 that is disposed on support structure 212. The multi-layer stack 210 can include a layer 220 comprising an n-doped material(s) having features 222 arranged in a pattern (e.g., a photonic lattice). As illustrated, an active region 228, which comprises an active material, can be formed between the n-doped layer(s) and a p-doped layer(s) 225. A low refractive index layer 229 comprising a material having a lower refractive index than that of the active material may be supported by active region 228, and may support layer 220. In such embodiments, light generated in the active region can pass through layer 229, a low absorption region, and can be emitted through the emission surface. Low refractive index layer 229 can allow greater extraction of photons (compared to a device without such a layer) by increasing the lifetime of the photons and, therefore, increasing the probability of the photons escaping through the emission surface. Furthermore, if some of the light is not emitted through the emission surface, but instead reflects downwards from the emission surface, the low refractive index layer may allow the light to reflect back towards the emission surface rather than being absorbed in the active region. The stack can also include an electrically conductive layer 230 which may serve as a p-side contact, and can also serve as an optically reflective layer. It should be appreciated that the LED is not limited to the configuration shown in FIG. 10; for instance, the n-doped and p-doped sides may be interchanged in certain embodiments.

Low refractive index layer 229 can be formed of any suitable material having a lower index of refraction than that of the active material. For example, in some embodiments, the active material of LED 200 has an index of refraction between 2.5-3.5 and low refractive index layer 229 is formed of a material having an index of refraction of less than 2.5 (e.g., aluminum nitride, epoxy). In some arrangements, the index of refraction of layer 229 is less than that of layer 225, which is less than that of layer 220. For instance, in one particular embodiment, layer 220, low refractive index layer 229, and p-doped layer 225 have refractive indices of 2.5, 2.3, and 2.4, respectively. Other arrangements are also possible. Refractive indices of materials are known and can be chosen by those of ordinary skill in the art.

The thickness of low refractive index layer 229 can vary and may be, for example, less than $\lambda/2$, less than $\lambda/6$, or less than $\lambda/10$ (e.g., between 100-400 nm, between 400-700 nm, or between 700-1000 nm thick).

In certain embodiments, the LED may emit light having a high power. The high power of emitted light may be a result of a pattern that influences the light extraction efficiency of the LED. For example, the light emitted by the LED may have a total power greater than 0.5 Watts (e.g., greater than 1 Watt, greater than 5 Watts, or greater than 10 Watts). In some embodiments, the light generated has a total power of less than 100 Watts, though this should not be construed as a limitation of all embodiments. The total power of the light emitted from an LED can be measured by using an integrating sphere equipped with spectrometer, for example a SLM12 from Sphere Optics Lab Systems. The desired power depends, at least in part, on the optical system that the LED is being utilized within. For example, a display system (e.g., a LCD system) may benefit from the incorporation of high brightness LEDs which can reduce the total number of LEDs that are used to illuminate the display system.

The light generated by the LED may also have a high total power flux. As used herein, the term "total power flux" refers to the total power divided by the emission area. In some embodiments, the total power flux is greater than 0.03 Watts/$mm^2$, greater than 0.05 Watts/$mm^2$, greater than 0.1 Watts/$mm^2$, or greater than 0.2 Watts/$mm^2$. However, it should be understood that the LEDs used in systems and methods presented herein are not limited to the above-described power and power flux values.

In some embodiments, the LED may be associated with a wavelength-converting region (not shown). The wavelength-converting region may be, for example, a phosphor region. The wavelength-converting region can absorb light emitted by the light-generating region of the LED and emit light having a different wavelength than that absorbed. In this manner, LEDs can emit light of wavelength(s) (and, thus, color) that may not be readily obtainable from LEDs that do not include wavelength-converting regions.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A light-emitting device comprising:
   a distribution of light-generating portions including respective active regions configured to generate light, the light-generating portions being devoid of a surface with a dielectric function that varies spatially according to a pattern; and
   at least one light extraction portion that allows generated light to pass therethrough, wherein the at least one light extraction portion is devoid of a light-generating portion including an active region, wherein the at least one light extraction portion includes a plurality of surface features designed to enhance light extraction, wherein at least 50% of the light generated is emitted through a surface of the at least one light extraction portion.

2. A light-emitting device of claim 1, wherein the at least one light-extraction portion comprises a dielectric function that varies spatially according to a first pattern.

3. A light-emitting device of claim 2, wherein the first pattern is a photonic lattice.

4. A light-emitting device of claim 1, further comprising a plurality of light extraction portions.

5. A light-emitting device of claim 4, wherein the light-generating portions are laterally separated from the plurality of light extraction portions.

6. A light-emitting device of claim 4, wherein the plurality of light extraction portions have a plurality of features that vary spatially according to a pattern.

7. A light-emitting device of claim 6, wherein the features are holes in a surface of the plurality of light extraction portions.

8. A light-emitting device of claim 1, wherein at least a part of a light-generating portion is not positioned above or below the at least one light extraction portion.

9. A light-emitting device of claim 1, wherein at least one light-generating portion is not positioned above or below the at least one light extraction portion.

10. A light-emitting device of claim 1, wherein at least one light-generating portion has a cross-sectional dimension equal to or less than a cross-sectional dimension of at least one light extraction portion.

11. A light-emitting device of claim 1, wherein the at least one light extraction portion comprises an optically reflective region.

12. A light-emitting device of claim 11, wherein the optically reflective region comprises a focusing element.

13. A light-emitting device of claim 11, wherein the optically reflective region comprises an optically reflective layer.

14. The light-emitting device of claim 1, wherein at least one light-generating portion has a cross-sectional dimension greater than five times a cross-sectional dimension of a surface feature of the at least one light extraction portion.

15. The light-emitting device of claim 1, wherein the at least one light extraction portion has a cross-sectional dimension greater than five times a cross-sectional dimension of a surface feature of the at least one light extraction portion.

16. The light-emitting device of claim 1, wherein at least 70% of the light generated is emitted through a surface of the at least one light extraction portion.

17. A light-emitting device comprising:
   a distribution of light-generating portions including respective active regions configured to generate light, the light-generating portions being devoid of a surface with a dielectric function that varies spatially according to a pattern; and at least one light extraction portion that allows generated light to pass therethrough, wherein at least a part of the at least one light extraction portion comprises a plurality of features that form a dielectric function that varies spatially according to a pattern and is devoid of a light-generating portion including an active region, wherein at least 50% of the light generated is emitted through a surface of the at least one light extraction portion.

18. A light-emitting device of claim 17, wherein the pattern is a photonic lattice.

19. A light-emitting device of claim 17, further comprising a plurality of light extraction portions.

20. A light-emitting device of claim 17, wherein at least one light-generating portion has a cross-sectional dimension equal to or greater than a cross-sectional dimension of the at least one light extraction portion.

21. A light-emitting device comprising:
a distribution of light-generating portions including respective active regions configured to generate light, each light-generating portion including an active region, and each light-generating portion being devoid of a surface with a dielectric function that varies spatially according to a pattern; and
at least one light extraction portion including an emission surface that allows generated light to pass therethrough, wherein at least a part of an active region is not positioned above or below the emission surface, and wherein the at least one light extraction portion includes a plurality of surface features on the emission surface designed to enhance light extraction, wherein at least 50% of the light generated is emitted through a surface of the at least one light extraction portion.

* * * * *